US010841571B2

(12) United States Patent
Sigle

(10) Patent No.: US 10,841,571 B2
(45) Date of Patent: Nov. 17, 2020

(54) VEHICLE CAMERA TESTING SYSTEM

(71) Applicant: MAGNA ELECTRONICS INC., Auburn Hills, MI (US)

(72) Inventor: Marc-Andre Sigle, Alzenau (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 295 days.

(21) Appl. No.: 15/189,327

(22) Filed: Jun. 22, 2016

(65) Prior Publication Data

US 2017/0006282 A1   Jan. 5, 2017

Related U.S. Application Data

(60) Provisional application No. 62/186,753, filed on Jun. 30, 2015.

(51) Int. Cl.
*H04N 17/00* (2006.01)
*G01R 31/28* (2006.01)
*G01R 31/00* (2006.01)

(52) U.S. Cl.
CPC ....... *H04N 17/004* (2013.01); *G01R 31/2808* (2013.01); *H04N 17/002* (2013.01); *G01R 31/007* (2013.01)

(58) Field of Classification Search
CPC ... H04N 17/004; H04N 17/002; G01R 31/007
USPC ...................................................... 348/187
See application file for complete search history.

(56) References Cited

U.S. PATENT DOCUMENTS

| | | | |
|---|---|---|---|
| 5,274,336 A * | 12/1993 | Crook ...................... | G01R 1/07 324/149 |
| 5,550,677 A | 8/1996 | Schofield et al. | |
| 5,670,935 A | 9/1997 | Schofield et al. | |
| 5,949,331 A | 9/1999 | Schofield et al. | |
| 6,759,850 B2 * | 7/2004 | Harzanu ............... | G01R 31/304 324/522 |
| 6,885,202 B2 * | 4/2005 | Slupsky ............. | G01R 31/3025 324/754.23 |
| 7,109,730 B2 * | 9/2006 | Slupsky ............. | G01R 31/3025 324/754.21 |
| 2007/0296435 A1 * | 12/2007 | Eldridge ............ | G01R 1/06711 324/754.03 |
| 2007/0297749 A1 | 12/2007 | Ain et al. | |
| 2008/0238583 A1 * | 10/2008 | Shelton .................... | H01P 5/18 333/24 R |
| 2008/0315865 A1 | 12/2008 | Doogue et al. | |
| 2009/0066356 A1 * | 3/2009 | Slupsky .................. | G01R 1/07 324/754.31 |
| 2009/0072843 A1 * | 3/2009 | Slupsky ............. | G01R 31/2889 324/750.01 |

(Continued)

*Primary Examiner* — Michael Lee
(74) *Attorney, Agent, or Firm* — Honigman LLP

(57) ABSTRACT

A test system for testing a device for use in a vehicle includes a coupling element that is one of (i) a capacitive coupling element, (ii) an inductive coupling element and (iii) a magnetic coupling element. The coupling element is electrically coupled to components of a PCB circuit of a vehicle device to at least one of (a) acquire analog or digital data or information or conditions from the PCB circuit and (b) induce information or conditions into the PCB circuit. The coupling element electrically couples to components of the PCB circuit without physical contact with the PCB circuit. The vehicle device may comprise a vehicle camera.

18 Claims, 9 Drawing Sheets

(56) References Cited

U.S. PATENT DOCUMENTS

| | | |
|---|---|---|
| 2009/0102494 A1* | 4/2009 | Miller .................. G01R 1/0491 |
| | | 324/750.01 |
| 2009/0140881 A1* | 6/2009 | Sakai ........................ B60R 1/00 |
| | | 340/901 |
| 2009/0323232 A1 | 12/2009 | Suzuki et al. |
| 2010/0045268 A1 | 2/2010 | Kilian |
| 2013/0154660 A1 | 6/2013 | Bucsa et al. |
| 2015/0039913 A1 | 2/2015 | Sugiyama et al. |
| 2015/0048798 A1 | 2/2015 | Godo et al. |
| 2016/0245869 A1 | 8/2016 | Asako |
| 2017/0234923 A1 | 8/2017 | Douglas et al. |

* cited by examiner

VEHICLE CAMERA TESTING SYSTEM

CROSS REFERENCE TO RELATED APPLICATION

The present application claims the filing benefits of U.S. provisional application Ser. No. 62/186,753, filed Jun. 30, 2015, which is hereby incorporated herein by reference in its entirety.

FIELD OF THE INVENTION

The present invention relates generally to a vehicle device, such as a camera for a vehicle vision system for a vehicle and, more particularly, to a method or system for testing electronics of a vehicle device or camera.

BACKGROUND OF THE INVENTION

Use of cameras or imaging sensors in vehicle imaging systems is common and known. Examples of such known systems are described in U.S. Pat. Nos. 5,949,331; 5,670,935 and/or 5,550,677, which are hereby incorporated herein by reference in their entireties.

Vehicle cameras include a camera housing and a lens and an imager (such as a two-dimensional imaging array sensor such as a CMOS imaging array sensor or the like), with the imager disposed at a printed circuit board (PCB) within the housing. The camera PCB includes a circuit grid comprising a plurality of conducting layers and electronic functional elements, which are placed onto the PCB's surface or may be embedded to the PCB. The PCB substrate typically comprises a glass fiber and epoxy (such as FR4) or a ceramic or laminated aluminum or may optionally comprise a flexible synthetic. Circuit structures may also be made by MID (Molded Interconnect Devices). These may have 3D structures.

For testing the camera circuit boards in production (such as in-circuit tests and during lens alignment), different test conditions must be implemented. Typically, the function of single components are tested in direct contact. Thus the test probe needles are brought into physical contact to each net of the circuit board. Typically, the circuit board has test points for that, which are uncoated areas of a specific size (typically round) that are conducting a specific part of the electric circuit which is the subject of the test (typically several needles are brought into electrical contact at the test points, for checking a specific circuit or electronics element or parameters, such as voltage, current, resistance, capacity, inductance and times, possibly in conjunction to a specific mode the camera circuit is set into).

SUMMARY OF THE INVENTION

The present invention provides a testing method or system using non-physically conducting test probes for in-circuit production tests, particularly for testing high density circuit boards, such as for the likes of vehicle cameras, body units, electronic control units (ECUs), head up displays (HUDs) and the like. The test includes coupling elements that comprise one of (i) a capacitive coupling element and (ii) an inductive coupling element. The coupling element is coupled to components of a PCB circuit of a vehicle device or camera to at least one of (a) acquire information (analog or digital data) or conditions from the PCB circuit and (b) induce information or conditions into the PCB circuit. The coupling element couples to components of the PCB circuit without physical contact with the PCB circuit, such as without placing a needle into electrical contact with the PCB circuit.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system uses one or more image sensors or cameras disposed at the vehicle and operates to capture images exterior (or optionally interior) of the vehicle and may process the captured image data to display images and to detect objects at or near or in the vehicle. The vision system includes an image processor or image processing system that is operable to receive image data from one or more cameras and provide an output, such as to a display device for displaying images representative of the captured image data, or such as for use in object detection or the like. The camera or cameras are individual cameras or sensors that are mounted at various locations at the interior or exterior of the vehicle, and include an imager, a printed circuit board and lens. The cameras are preferably very small to minimize packaging concerns and aesthetic concerns when mounted at the vehicle.

The production of small cameras requires reduction the amount of test points. This contradicts the need and requirement to access each circuit node on a PCB to test every component electrically. The minimum size of test points as well as the distance necessary in between the test points, worsens the situation dramatically with the needed camera size. Test points are subject to elimination additionally out of the reason that these can cause radiated disturbances when being conducted to HF circuits.

Functional tests are often used to test components in additionally or in absence of test points.

Figure 4:
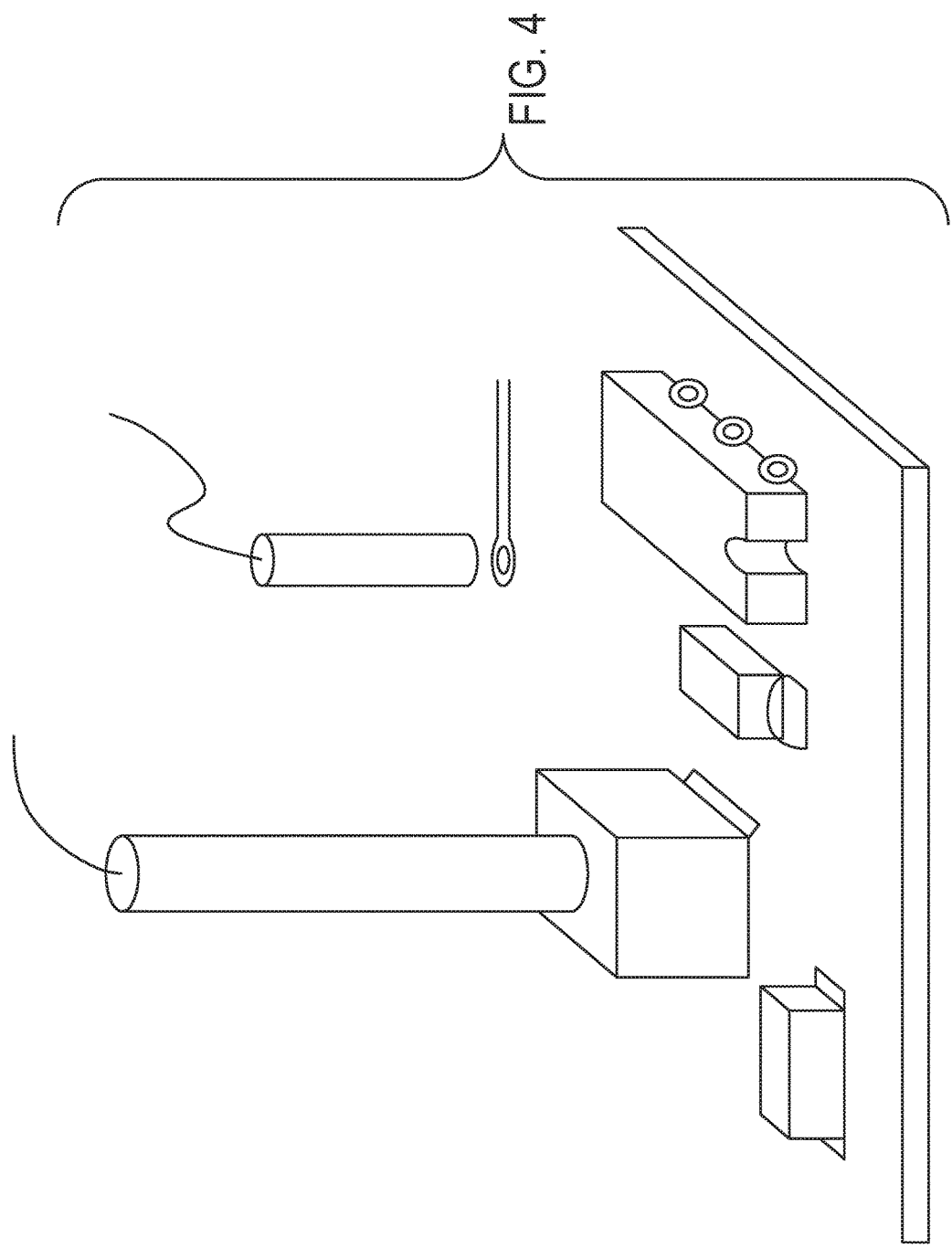
FIG. 4 shows examples of how coupling probes may be placed above physical electrical components or vias for detecting.
Figure 5:
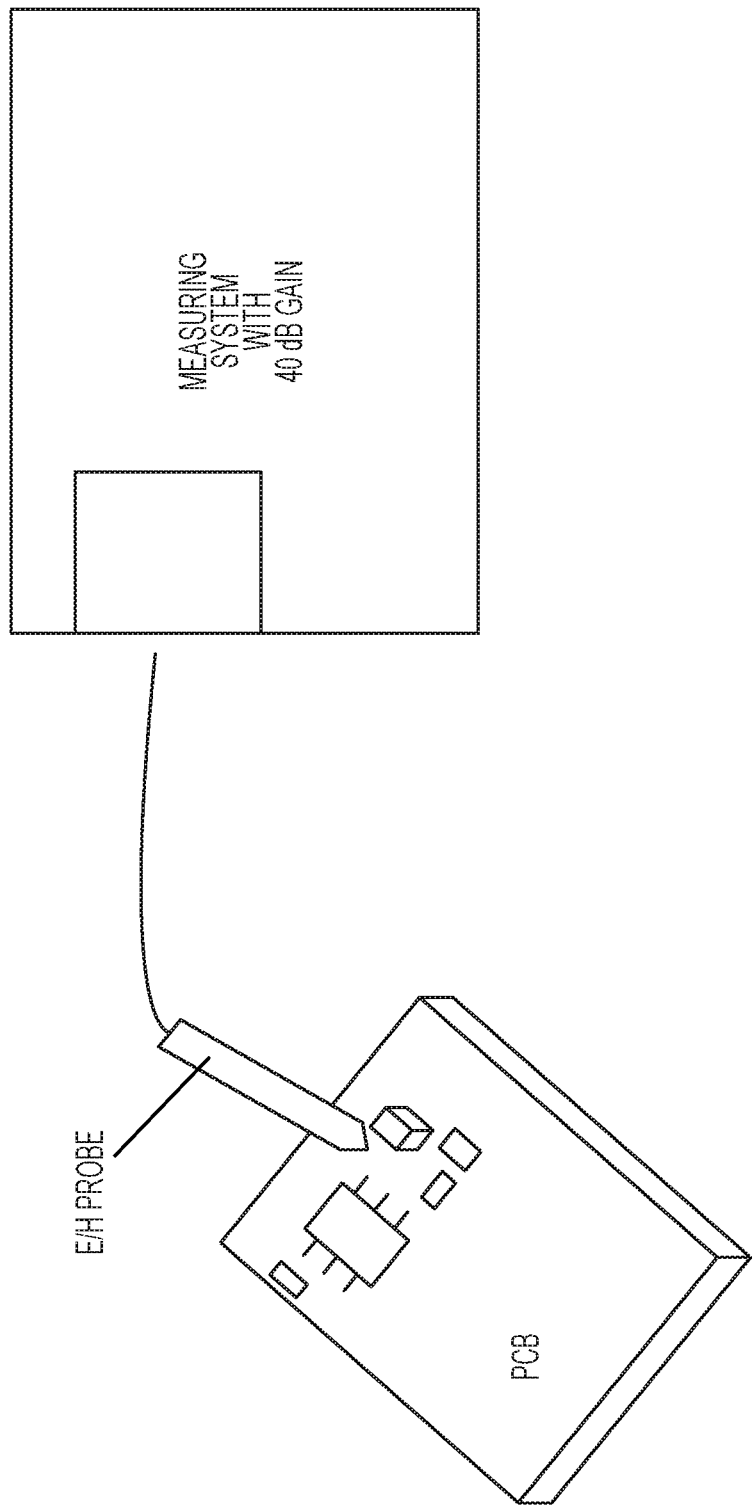
FIG. 5 shows a E/H coupling probe connecting to a measuring system that has a signal amplification of 40 dB.

The system of the present invention may keep the test coverage of a PCB in circuit tests (ICT) high while minimizing the space required for test points. The testing system of the present invention uses an inductive coupler or probe (similar to, for example, a Langer RF R 3-2 probe or the like) placed above circuit elements that have a substantial current flow, such as capacitor or coils (or inductors), which are part of a functional module on the PCB instead of contacting a circuit node electrically, in order to test that module on a PCB for its function, such as shown in FIG. 4 and FIG. 5. The probe signals are typically very low for that signal amplification will be typically necessary.

Figure 6:
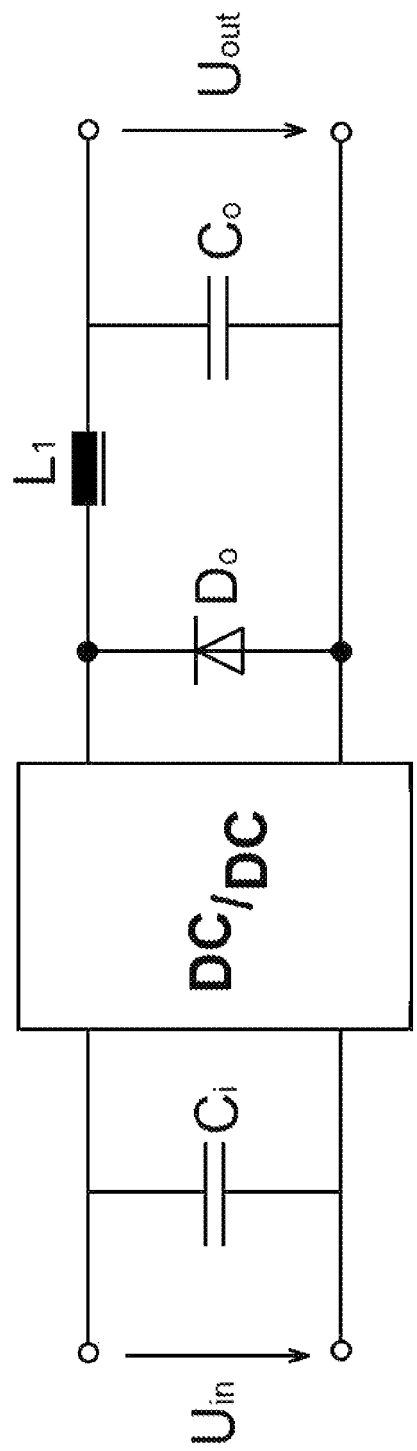
FIG. 6 is a schematic of an exemplary switch mode supply circuit.
Figure 7:
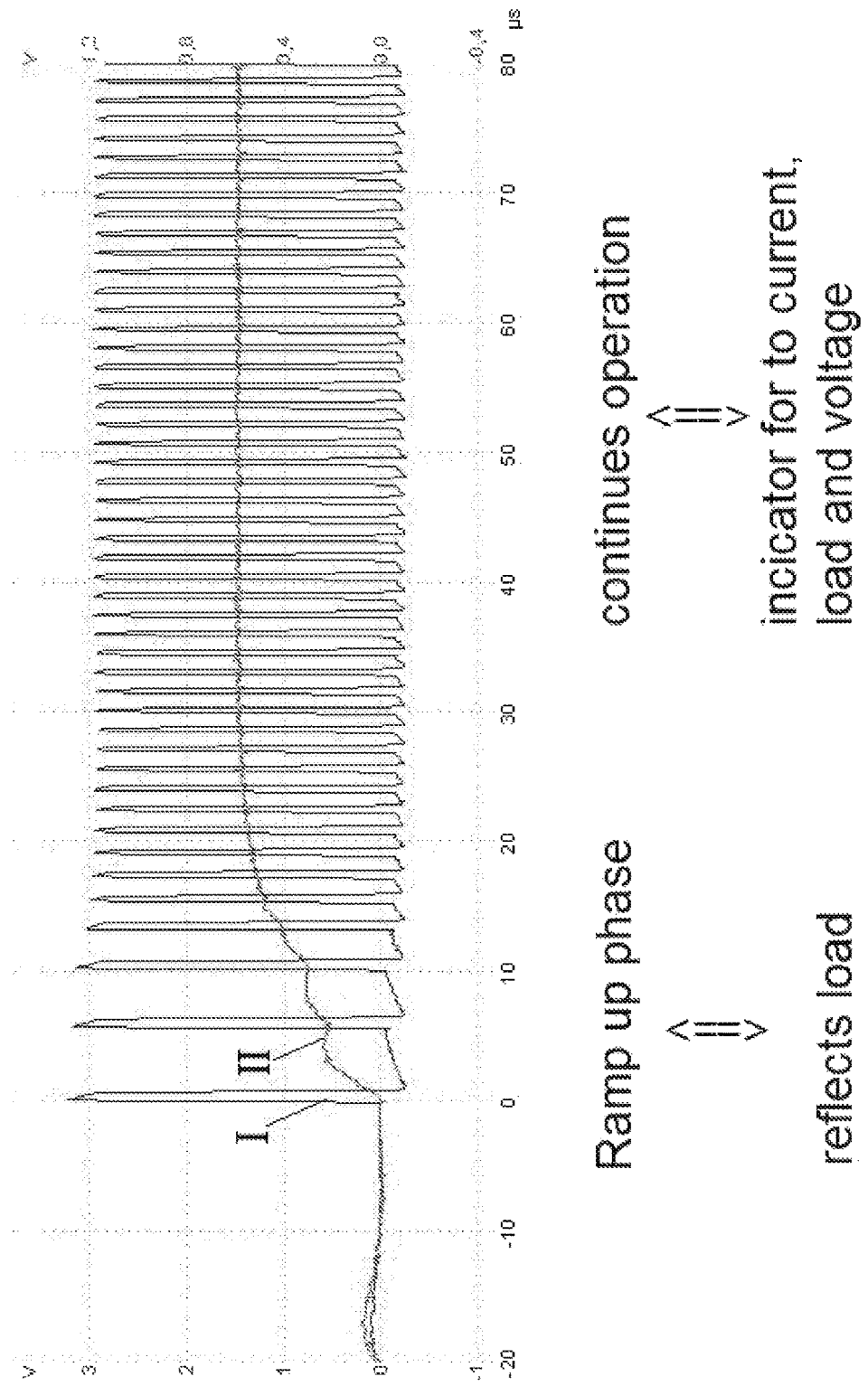
FIG. 7 shows the oscillating voltage signal I and the current signal II of a switch mode supply under load as shown in FIG. 6, measured by electromagnetic coupling on L1 of the circuit of FIG. 6, where the circuit's load may be determined under use of knowledge of the circuitry, other parameter and conditions.
Figure 8:
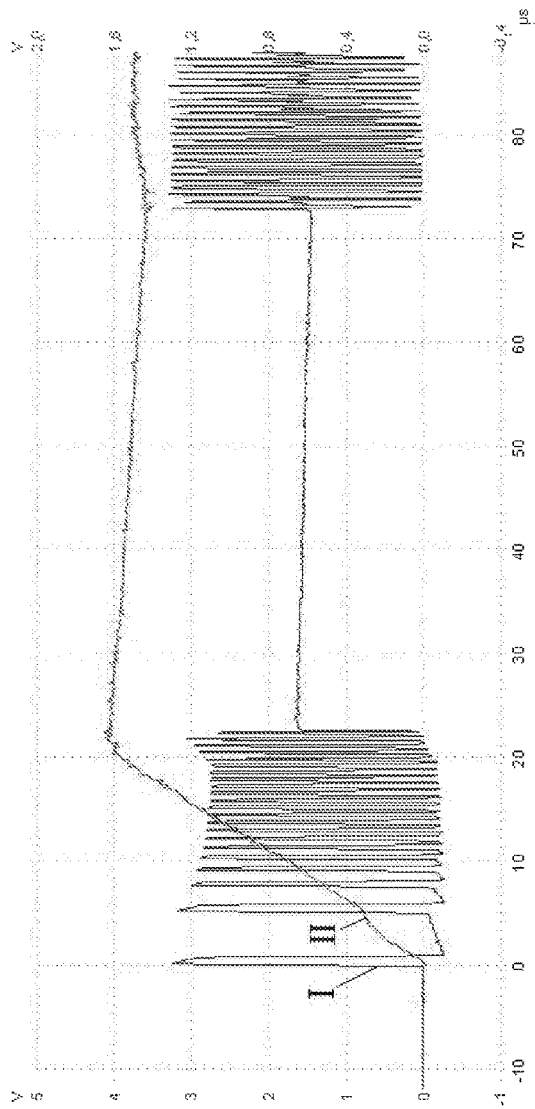
FIG. 8 shows the oscillating voltage signal I and the current signal II of a switch mode supply of the circuit of FIG. 6, and the resulting voltage signal II when the load is substantially lower than that shown in the test condition of FIG. 7.

For another example, such as in the circuit of FIG. 6, the signal of a coil of a switched mode supply can be measured by an E/H-Probe placed above the coil L1. Using the electromagnetic field radiated by the coil during startup (see FIG. 7) and after startup (see FIG. 8) to measure current, voltage, frequency, duty cycle and the start-up ramp allows conclusions on electrical contact as well as value ranges on most of the components of the functional module supply as well as provides a hint as to the function of the consumer element (load) connected to the supply.

Also, capacitive coupling can be used when a capacitive coupler or probe is placed above components emitting an electrical field (that are part of a functional module on the PCB) instead of contacting a net directly to test a module on a PCB for its function.

Figure 1:
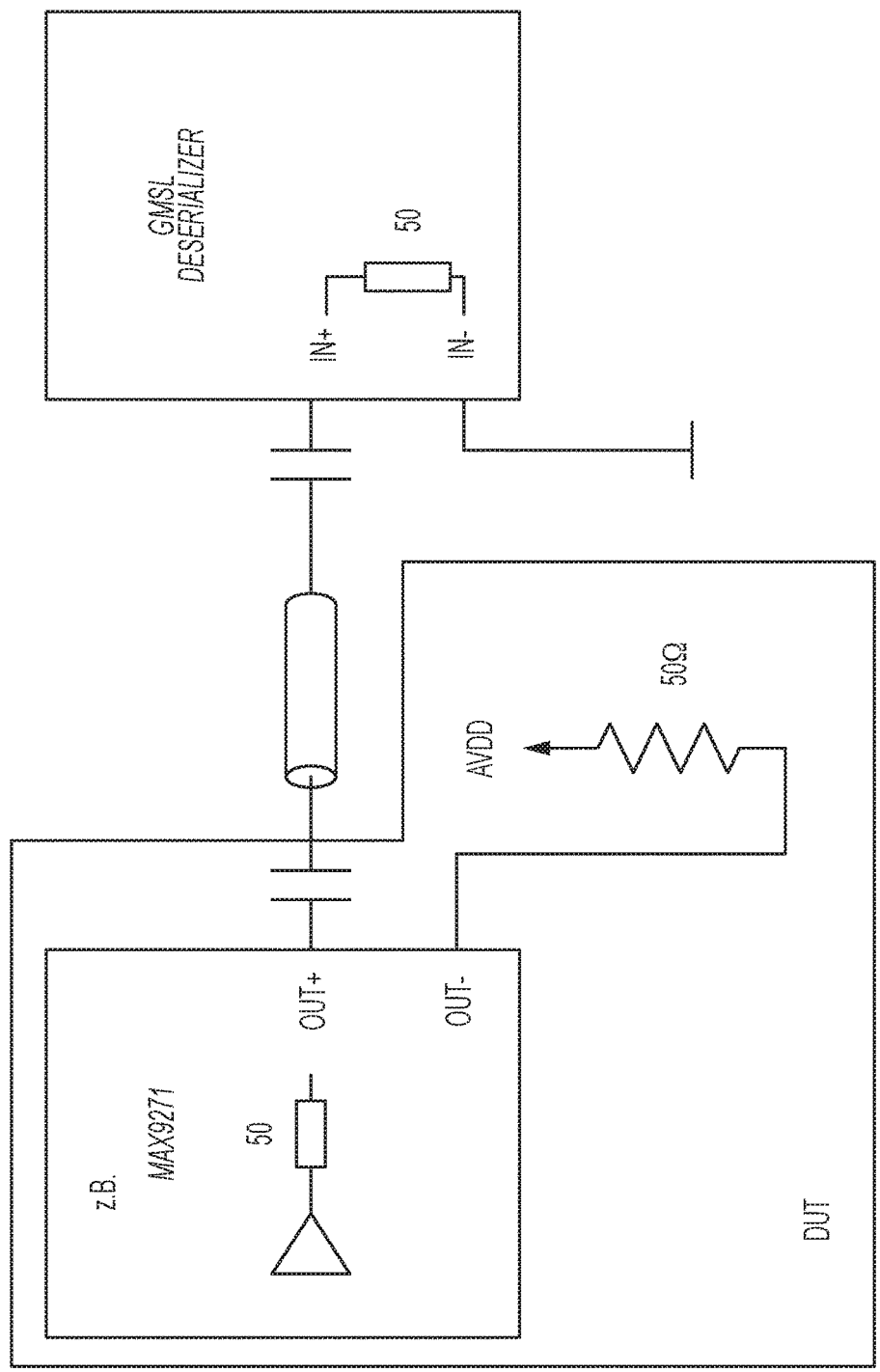
FIG. 1 is a circuit showing a VDD capacitor of an asymmetric LVDS serializer stage used to test that stage in an LVDS system in accordance with the present invention.
Figure 2:
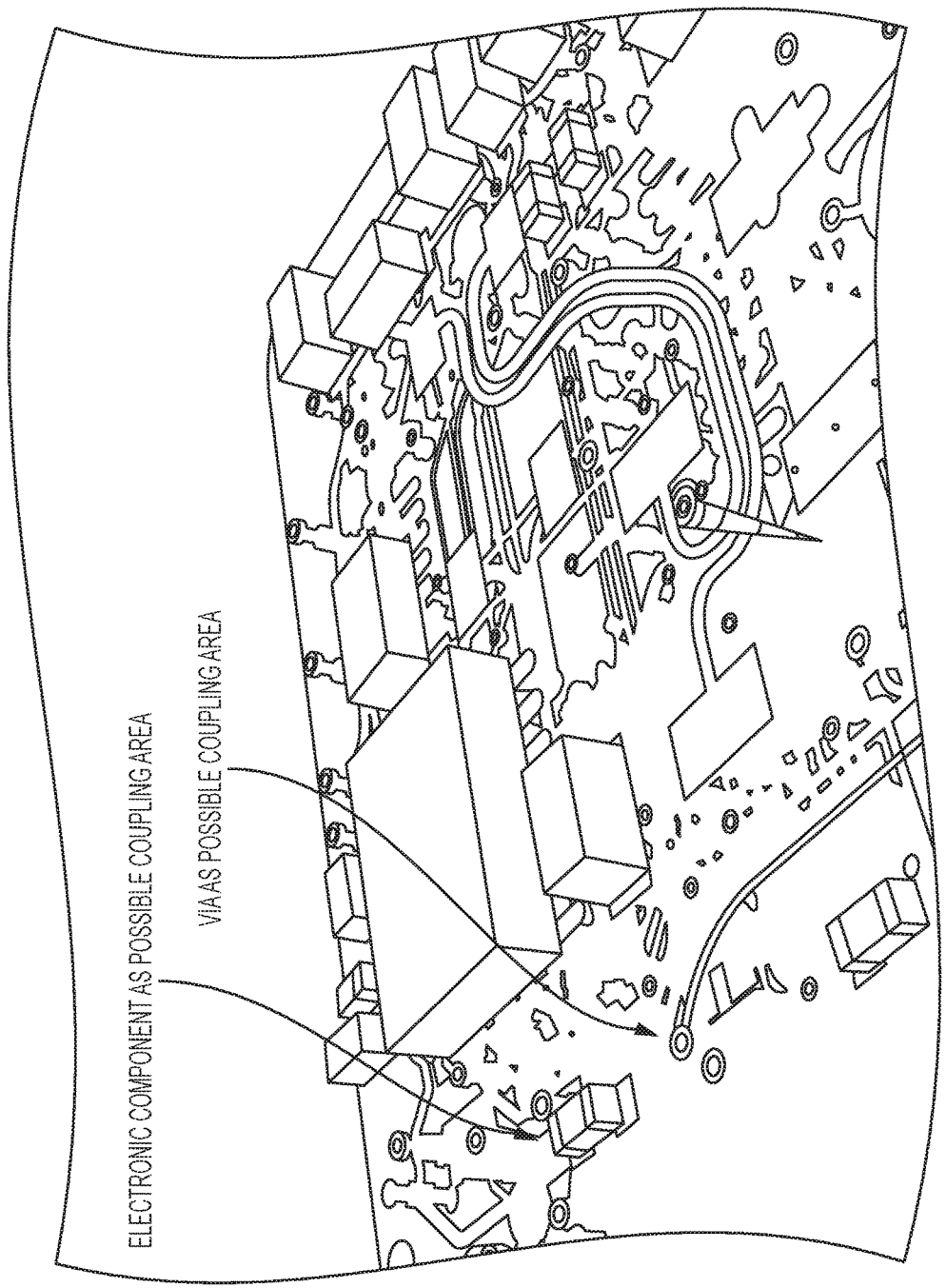
FIG. 2 is a circuit showing locations where inductive or capacitive coupling probes can be placed to measure electrical signals through coupling (such as at, for example, vias, capacitors and coils) in accordance with the present invention.

A capacitive coupler (similar to, for example, a Langer RF E 10 coupler) may be placed above (preferably proximate to but not in physical contact with) a resistor, capacitor or circuit node that is part of the PCB. As an example, a VDD capacitor of an asymmetric LVDS serializer stage may be used to test that stage in an LVDS system, such as shown in the circuit of FIG. 1 comprised in a circuit such as shown in FIG. 2. Using the electrical near field radiated by the capacitor during LVDS information transmission, the information of the signal can be captured without physical contact with the circuit node or placing a needle onto the circuit node, but by placing a capacitive coupler in proximity to or close to the VDD capacitor, such as also shown in FIG. 2.

Figure 9:
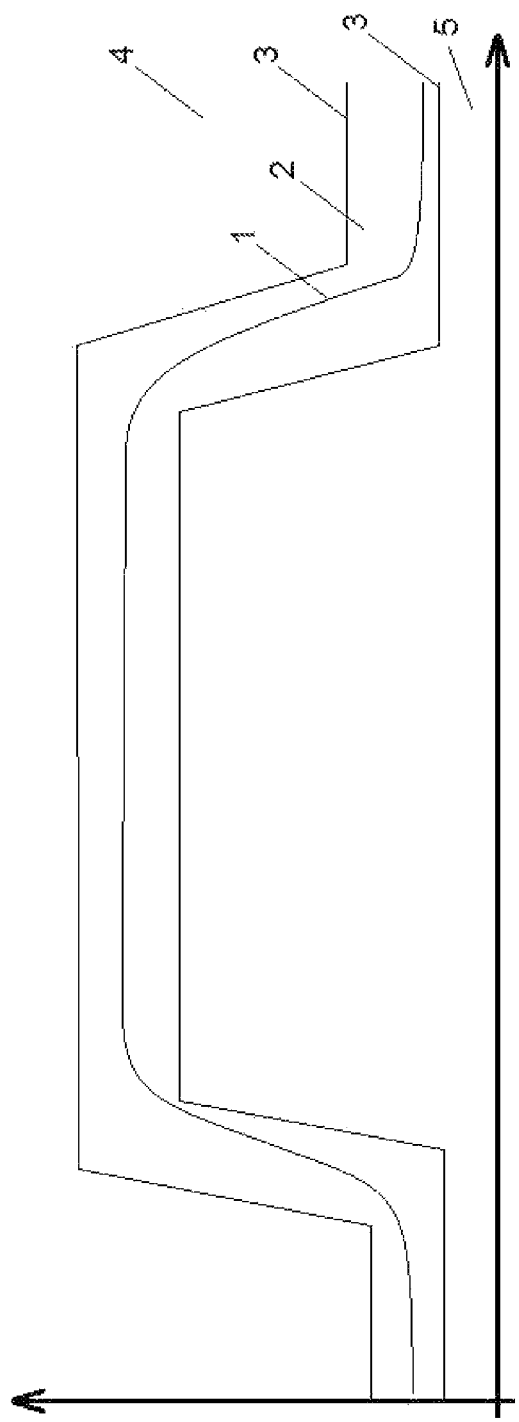
FIG. 9 shows a masking method, where a signal 1 of an electrical circuit may have a signal sequence which is acceptable when it stays within an allowed corridor 2 with its borderlines 3, and if the signal enters the area above 4 or below 5 of the corridor, the signal test may be evaluated as a failure.

To conclude the correct assembly of a PCB's circuit, such as done in fab ICT, a common practice is masking. The masking method is shown in FIG. 9. Masking may also find use when using coupling probe signal sampling methods in accordance with the present invention, independent which SI unit may be measured by the used probes.

The test system of the present invention may use capacitive, inductive and magnetic (Hall) coupling (probing) to components of the PCB circuit to acquire information (analog or digital data) or conditions from the PCB circuit or to induce information or conditions into the PCB necessary during analysis or lens assembly/alignment.

In the example above, a capacitive coupler was placed above an LVDS capacitor. This probe's signal may be amplified, analyzed and recorded.

Synthetic or recorded signals may also be induced by capacitive or inductive coupling for circuit analysis or during lens assembly to activate certain operating modes. It may be possible to generate borderline conditions (of the whole system or just parts of the circuit) which a well-functioning circuit (with low age components) may never show for testing the borderline behavior.

Figure 3:
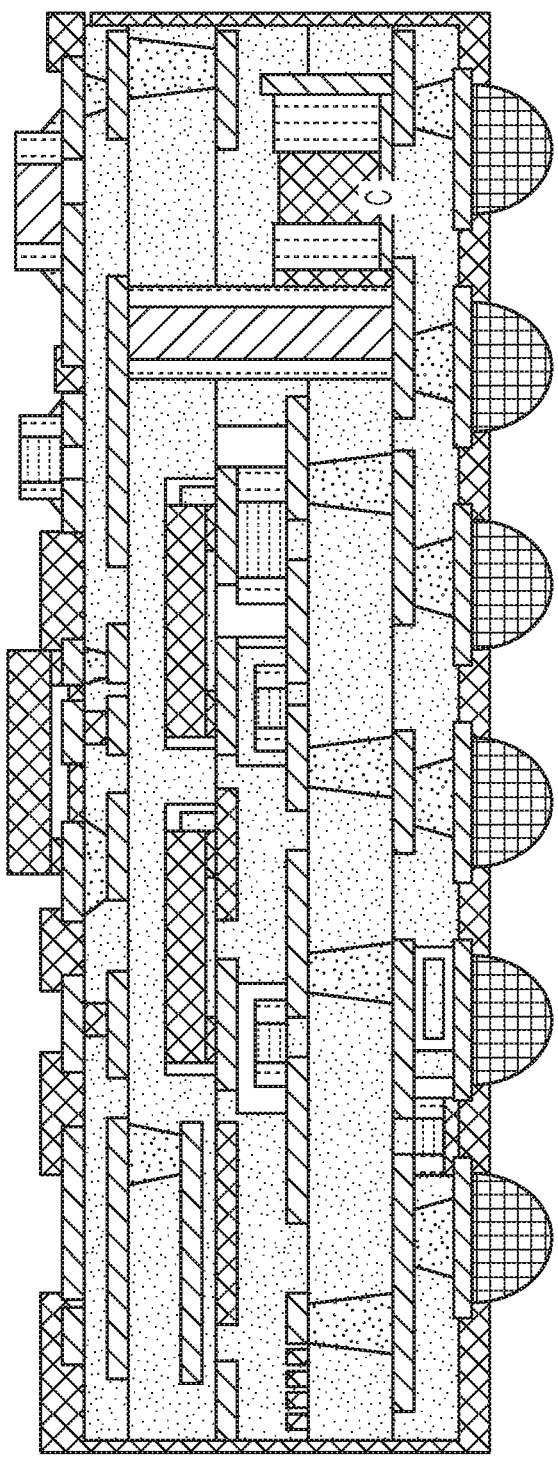
FIG. 3 is a highly compact circuit board with embedded electronic elements, suitable for testing in accordance with the present invention.

As an additional advantage of the system of the present invention using capacitive, inductive or magnetic test probes, these probes are able to probe circuit nodes or components underneath the PCB's surface, possibly embedded to the PCB. Such a capability enables the system to also use the above test methods on highly compact circuit boards such as stacked ceramics with embedded electronic elements, such as shown, for example, in FIG. 3. Shielding surfaces, such as large copper layers, may prohibit or diminish the possibility to use non-conducting test probes as discussed above.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an EyeQ2 or EyeQ3 image processing chip available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 8,694,224; 7,005,974; 5,760,962; 5,877,897; 5,796,094; 5,949,331; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 7,881,496; 7,720,580; 7,038,577; 6,882,287; 5,929,786 and/or 5,786,772, and/or International Publication Nos. WO 2011/028686; WO 2010/099416; WO 2012/061567; WO 2012/068331; WO 2012/075250; WO 2012/103193; WO 2012/0116043; WO 2012/0145313; WO 2012/0145501; WO 2012/145818; WO 2012/145822; WO 2012/158167; WO 2012/075250; WO 2012/0116043; WO 2012/0145501; WO 2012/154919; WO 2013/019707; WO 2013/016409; WO 2013/019795; WO 2013/067083; WO 2013/070539; WO 2013/043661; WO 2013/048994; WO 2013/063014, WO 2013/081984; WO 2013/081985; WO 2013/074604; WO 2013/086249; WO 2013/103548; WO 2013/109869; WO 2013/123161; WO 2013/126715; WO 2013/043661; WO 2013/158592 and/or WO 2014/204794, which are all hereby incorporated herein by reference in their entireties. The system may communicate with other communication systems via any suitable means, such as by utilizing aspects of the systems described in International Publication Nos. WO/2010/144900; WO 2013/043661 and/or WO 2013/081985, and/or U.S. Publication No. US-2012-0062743, which are hereby incorporated herein by reference in their entireties.

The camera module and circuit chip or board and imaging sensor may be implemented and operated in connection with various vehicular vision-based systems, and/or may be operable utilizing the principles of such other vehicular systems, such as a vehicle headlamp control system, such as the type disclosed in U.S. Pat. Nos. 5,796,094; 6,097,023; 6,320,176; 6,559,435; 6,831,261; 7,004,606; 7,339,149 and/or 7,526,103, which are all hereby incorporated herein by reference in their entireties, a rain sensor, such as the types disclosed in commonly assigned U.S. Pat. Nos. 6,353,392; 6,313,454; 6,320,176 and/or 7,480,149, which are hereby incorporated herein by reference in their entireties, a vehicle vision system, such as a forwardly, sidewardly or rearwardly directed vehicle vision system utilizing principles disclosed in U.S. Pat. Nos. 5,550,677; 5,670,935; 5,760,962; 5,877,897; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978 and/or 7,859,565, which are all hereby incorporated herein by reference in their entireties, a trailer hitching aid or tow check system, such as the type disclosed in U.S. Pat. No. 7,005,974, which is hereby incorporated herein by reference in its entirety, a reverse or sideward imaging system, such as for a lane change assistance system or lane departure warning system or for a blind spot or object detection system, such as imaging or detection systems of the types disclosed in U.S. Pat. Nos. 7,881,496; 7,720,580; 7,038,577; 5,929,786 and/or 5,786,772, which are hereby incorporated herein by reference in their entireties, a video device for internal cabin surveillance and/or video telephone function, such as disclosed in U.S. Pat. Nos. 5,760,962; 5,877,897; 6,690,268 and/or 7,370,983, and/or U.S. Publication No. US-2006-0050018, which are hereby incorporated herein by reference in their entireties, a traffic sign recognition system, a system for determining a distance to a leading or trailing vehicle or object, such as a system utilizing the principles disclosed in U.S. Pat. Nos. 6,396,397 and/or 7,123,168, which are hereby incorporated herein by reference in their entireties, and/or the like.

Optionally, the vision system (utilizing the forward facing camera and a rearward facing camera and other cameras disposed at the vehicle with exterior fields of view) may be part of or may provide a display of a top-down view or birds-eye view system of the vehicle or a surround view at the vehicle, such as by utilizing aspects of the vision systems described in International Publication Nos. WO 2010/099416; WO 2011/028686; WO 2012/075250; WO 2013/019795; WO 2012/075250; WO 2012/145822; WO 2013/081985; WO 2013/086249 and/or WO 2013/109869, and/or U.S. Publication No. US-2012-0162427, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A test system for testing vehicular camera circuitry, said test system comprising:
   a coupling element, wherein said coupling element comprises one selected from the group consisting of (i) a capacitive coupling element, (ii) an inductive coupling element and (iii) a magnetic coupling element;
   wherein said coupling element is electrically coupled to a component of a printed circuit board (PCB) circuit of a printed circuit board of a vehicular camera to induce information or conditions associated with the coupled component;
   wherein the PCB circuit is independent from said test system, and wherein the coupled component of the PCB circuit of the vehicular camera is associated with at least one operating mode of the vehicular camera;
   wherein said coupling element electrically couples to the coupled component of the PCB circuit of the vehicular camera without physical contact between said coupling element of said test system and the PCB circuit of the vehicular camera; and
   wherein, responsive to inducing information or conditions associated with the coupled component of the PCB circuit of the vehicular camera, the at least one operating mode of the vehicular camera associated with the coupled component is activated.

2. The test system of claim 1, wherein said coupling element is electrically coupled to the coupled component of the PCB circuit of the vehicular camera during camera analysis or lens assembly and alignment.

3. The test system of claim 1, wherein said coupling element is operable to probe circuit nodes or components underneath a surface of the printed circuit board.

4. The test system of claim 1, wherein said coupling element comprises a capacitive coupling element.

5. The test system of claim 4, wherein, during testing of the vehicular camera, said capacitive coupling element is placed near a capacitor that is part of the PCB circuit.

6. The test system of claim 5, wherein said capacitive coupling element uses an electrical near field radiated by said capacitor during an in circuit test for concluding at least one selected from the group consisting of (i) electrical contact, (ii) value ranges of electrical components, (iii) a functional module supply and (iv) a function of a grid area or electrical component.

7. The test system of claim 6, wherein two or more capacitive coupling elements are used in combination by being placed at the PCB circuit during an in circuit test for concluding at least one selected from the group consisting of (i) electrical contact, (ii) a function or value ranges of a substantial amount of electrical components, (iii) a functional module supply and (iv) a function of a grid area.

8. The test system of claim 4, wherein, during testing of the vehicular camera, said capacitive coupling element is placed near a via of the printed circuit board that is in the path of an LVDS signal.

9. The test system of claim 1, wherein said coupling element is electrically coupled to the coupled component of the PCB circuit of the vehicular camera to acquire information or conditions from the PCB circuit.

10. The test system of claim 1, wherein said coupling element is electrically coupled to the coupled component of the PCB circuit of the vehicular camera to acquire analog or digital data from the PCB circuit.

11. The test system of claim 1, wherein said coupling element comprises an inductive coupling element.

12. The test system of claim 11, wherein, during testing of the vehicular camera, said inductive coupling element is placed near an inductor that is part of the PCB circuit.

13. The test system of claim 12, wherein said inductive coupling element uses an electromagnetic near field radiated by said inductor during an in circuit test for concluding at least one selected from the group consisting of (i) electrical contact, (ii) value ranges of electrical components, (iii) a functional module supply and (iv) a function of a grid area or electrical component.

14. The test system of claim 13, wherein two or more inductive coupling elements are used in combination by being placed at the PCB circuit during an in circuit test for concluding at least one selected from the group consisting of (i) electrical contact, (ii) a function or value ranges of a substantial amount of electrical components, (iii) a functional module supply and (iv) a function of a grid area.

15. A test system for testing vehicular camera circuitry, said test system comprising:
a coupling element, wherein said coupling element comprises one selected from the group consisting of (i) a capacitive coupling element and (ii) an inductive coupling element;
wherein said coupling element is electrically coupled to a component of a printed circuit board (PCB) circuit of a printed circuit board of a vehicular camera to induce information or conditions associated with the coupled component;
wherein the PCB circuit is independent from the test system, and wherein the coupled component of the PCB circuit of the vehicular camera is associated with at least one operating mode of the vehicular camera;
wherein said coupling element electrically couples to the coupled component of the PCB circuit of the vehicular camera without physical contact between said coupling element of the test system and the PCB circuit of the vehicular camera;
wherein the coupled component of the PCB circuit of the vehicular camera comprises a capacitor or inductor;
wherein two or more coupling elements are used in combination by being placed at the PCB circuit of the vehicular camera during an in circuit test for concluding at least one selected from the group consisting of (i) electrical contact, (ii) a function or value ranges of a substantial amount of electrical components, (iii) a functional module supply and (iv) a function of a grid area; and
wherein, responsive to inducing information or conditions associated with the coupled component of the PCB circuit of the vehicular camera, the at least one operating mode of the vehicular camera associated with the coupled component is activated.

16. The test system of claim 15, wherein said coupling elements are operable to probe circuit nodes or components underneath a surface of the printed circuit board.

17. A test system for testing vehicular camera circuitry, said test system comprising:
a coupling element, wherein said coupling element comprises one selected from the group consisting of (i) a capacitive coupling element and (ii) an inductive coupling element;
wherein said coupling element is electrically coupled to a component of a printed circuit board (PCB) circuit of a printed circuit board of a vehicular camera to induce information or conditions associated with the coupled component;
wherein the PCB circuit is independent from the test system, and wherein the coupled component of the PCB circuit of the vehicular camera is associated with at least one operating mode of the vehicular camera;
wherein said coupling element electrically couples to the coupled component of the PCB circuit of the vehicular camera without physical contact between said coupling element of the test system and the PCB circuit of the vehicular camera;
wherein said capacitive coupling element uses an electrical near field radiated by the coupled component of the PCB circuit of the vehicular camera during an in circuit test for concluding at least one selected from the group consisting of (i) electrical contact, (ii) value ranges of electrical components, (iii) a functional module supply and (iv) a function of a grid area or electrical component;
wherein said coupling element is electrically coupled to the coupled component of the PCB circuit of the vehicular camera during camera analysis or lens assembly and alignment; and
wherein, responsive to inducing information or conditions associated with the coupled component of the PCB circuit of the vehicular camera, the at least one operating mode of the vehicular camera associated with the coupled component is activated.

18. The test system of claim 17, wherein said coupling element is operable to probe a component of the PCB circuit underneath a surface of the printed circuit board.

* * * * *